US007632755B2

(12) United States Patent
Kim

(10) Patent No.: US 7,632,755 B2
(45) Date of Patent: Dec. 15, 2009

(54) METHOD FOR FORMING AN INTERMETAL DIELECTRIC LAYER USING LOW-K DIELECTRIC MATERIAL AND A SEMICONDUCTOR DEVICE MANUFACTURED THEREBY

(75) Inventor: Hyoung Yoon Kim, Cheongiu-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 467 days.

(21) Appl. No.: 11/317,365

(22) Filed: Dec. 23, 2005

(65) Prior Publication Data

US 2006/0138666 A1 Jun. 29, 2006

(30) Foreign Application Priority Data

Dec. 29, 2004 (KR) ............... 10-2004-0115790

(51) Int. Cl.
*H01L 21/44* (2006.01)
(52) U.S. Cl. .................. 438/669; 257/E21.252
(58) Field of Classification Search ............ 438/421, 438/424, 435, 436, 437, 438, 669; 257/E21.252
See application file for complete search history.

(56) References Cited

U.S. PATENT DOCUMENTS

| 6,136,665 | A | * | 10/2000 | Ku et al. | ............... 438/438 |
| 7,052,932 | B2 | * | 5/2006 | Huang et al. | ............ 438/105 |
| 2005/0153519 | A1 | * | 7/2005 | Lu et al. | ............... 438/424 |

* cited by examiner

*Primary Examiner*—Sonya D McCall-Shepard
(74) *Attorney, Agent, or Firm*—The Law Offices of Andrew D. Fortney; Andrew D. Fortney; Duangkamol K. Strohl

(57) ABSTRACT

Disclosed are: (i) a method for forming an intermetal dielectric layer between metal wirings using a low-k dielectric material, and (ii) a semiconductor device with an intermetal dielectric layer comprising a low-k dielectric material. The method comprises the steps of: (a) forming a metal layer on a semiconductor substrate; (b) forming a plurality of metal wiring patterns by etching the metal layer selectively; (c) forming a first dielectric layer on the substrate and the plurality of metal wiring patterns; (d) forming a low-k dielectric layer on the first dielectric layer, the low-k dielectric layer having a lower dielectric constant than the first dielectric layer; and (e) forming a second dielectric layer on the low-k dielectric layer.

16 Claims, 3 Drawing Sheets

METHOD FOR FORMING AN INTERMETAL DIELECTRIC LAYER USING LOW-K DIELECTRIC MATERIAL AND A SEMICONDUCTOR DEVICE MANUFACTURED THEREBY

This application claims the benefit of Korean Application No. 10-2004-0115790, filed on Dec. 29, 2004, which is hereby incorporated by reference herein in its entirety.

BACKGROUND OF THE INVENTION

1. Field of the Invention

The present invention relates to a semiconductor device manufacturing technology. More specifically, the present invention relates to a method for forming an intermetal dielectric layer between metal wirings using a low-k dielectric material, and a semiconductor device with the intermetal dielectric layer formed thereby.

2. Description of the Related Art

Following a higher integration and higher operational speed of a semiconductor device, metal wirings have been miniaturized more and more. However, the miniaturization of metal wirings can cause problems such as a resistance-capacitance delay (RC delay), deteriorating the operational speed of the semiconductor device.

Conventionally, copper (Cu) and aluminum (Al) have been developed as materials for metal wiring in Large Scale Integrated (LSI) circuits, because of their low electrical resistance and high tolerance to electromigration (EM). Especially, copper tends to be more widely used than aluminum, when the device has a critical dimension of 0.13 μm or less. However, it is not easy to etch a copper layer. Accordingly, a so-called damascene method has been generally used to form a copper wiring in semiconductor devices.

Meanwhile, because of a high manufacturing cost of the damascene method, using an aluminum wiring in the device of 0.13 μm or less has been increasing recently. However, an aluminum wire must have a sufficiently great height or thickness so as to provide a desired resistance. Accordingly, the aspect ratio of the gap formed between the aluminum wiring patterns may be increased, and thus, it becomes difficult to fill the gap between aluminum lines with a dielectric material.

In order to facilitate the gap filling with the dielectric material, decreasing the height or thickness of the aluminum wiring may increase the resistance-capacitance delay (RC delay) of the device. Furthermore, in order to compensate for the increase of the RC delay, a low-k dielectric material, having a lower dielectric constant than a conventional dielectric material such as a fluorinated silicate glass (FSG), can be used as an intermetal dielectric material. However, a low-k dielectric material generally has a problem in the manufacturing aspect. For example, it is difficult to form a via-hole inside a layer of a low-k dielectric material. Moreover, certain ingredients of certain low-k dielectric materials can be diffused into aluminum wiring patterns, thus causing defects such as a corrosion of the aluminum wiring.

SUMMARY OF THE INVENTION

It is, therefore, an object of the present invention to provide a method for forming an intermetal dielectric layer using a low-k dielectric material, thereby enabling improvement of an operational speed of a semiconductor device.

Another object of the present invention is to provide a method for forming an intermetal dielectric layer using a low-k dielectric material, wherein the low-k dielectric material is encompassed by further stable intermetal dielectric layers, thereby inhibiting or preventing ingredients or components of the low-k dielectric material from diffusing into adjacent metal wiring patterns.

It is still another object of the present invention to provide a semiconductor device with a low-k dielectric layer as a component of a dielectric layer between metal layers, in which the device has a relatively high operational speed.

To achieve the above objects, an embodiment of a method for forming a dielectric layer between metal wiring layers using a low-k dielectric material, according to the present invention, comprises the steps of: (a) forming a metal layer on a semiconductor substrate; (b) forming a plurality of metal wiring patterns by etching the metal layer selectively; (c) forming a first dielectric layer on the substrate and the plurality of metal wiring patterns; (d) forming a low-k dielectric layer on the first dielectric layer, the low-k dielectric layer having a lower dielectric constant than the first dielectric layer; and (e) forming a second dielectric layer on the low-k dielectric layer.

Here, the first dielectric layer preferably covers a profile of the plurality of metal wiring patterns, and at least partially fills a gap between adjacent metal wiring patterns. In addition, step (d) preferably comprises: (d1) applying the low-k dielectric material on the first dielectric layer; (d2) filling the gap with the low-k dielectric material by rotating the substrate; (d3) solidifying or densifying the low-k dielectric material by heat-treatment, thereby forming the low-k dielectric layer between the adjacent metal wiring patterns; and (d4) removing a portion of the low-k dielectric material over an upper surface of the plurality of metal wiring patterns. Preferably, the low-k dielectric layer comprises a SiOC-based spin-on material, and the second dielectric layer comprises substantially the same material as the first dielectric layer.

In addition, a semiconductor device with a low-k dielectric layer, according to the present invention, comprises: at least one layer of metal wiring on a semiconductor substrate, the layer of metal wiring including a plurality of metal wiring patterns; a first dielectric layer on the substrate and the plurality of metal wiring patterns; a low-k dielectric layer in a gap between adjacent metal wiring patterns, the low-k dielectric layer having a lower dielectric constant than the first dielectric layer; and a second dielectric layer covering the first dielectric layer and the low-k dielectric layer. Preferably, the low-k dielectric layer comprises a SiOC-based spin-on material, and the second dielectric layer comprises substantially the same material as the first dielectric layer.

These and other aspects of the invention will become evident by reference to the following description of the invention, often referring to the accompanying drawings.

DETAILED DESCRIPTION OF THE INVENTION

Figure 1:
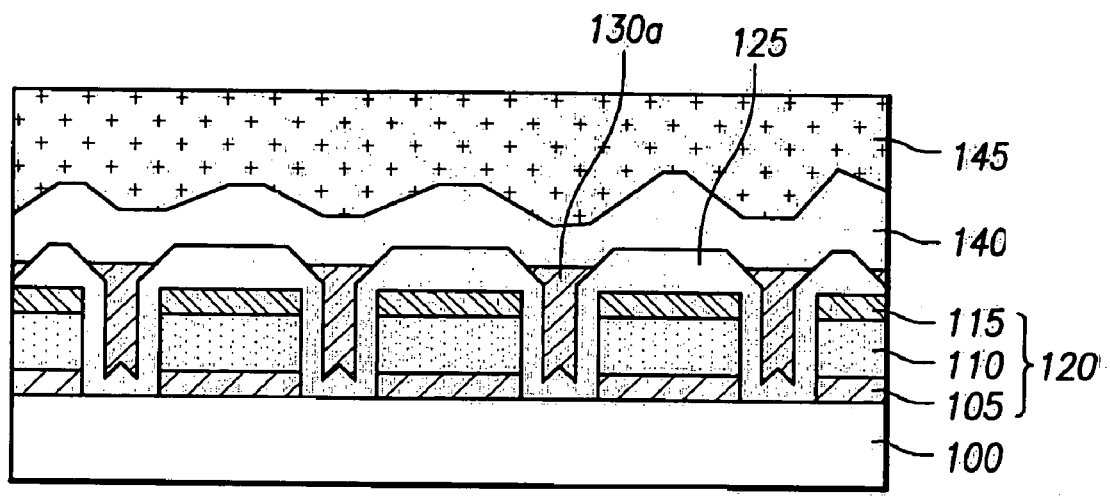
FIG. 1 is a cross-sectional view showing a semiconductor device with a low-k dielectric layer in accordance with an embodiment of the present invention.

FIG. 1 is a cross-sectional view of an embodiment of a semiconductor device with a low-k dielectric layer according to the present invention.

Referring to FIG. 1, a plurality of metal wiring patterns 120 are on a substrate 100, and a first dielectric layer 125 is on the substrate 100 and the plurality of metal wiring patterns 120. The substrate 100 may include a single crystal silicon substrate that may have an epitaxial silicon or silicon-germanium layer thereon, and/or the substrate 100 may have an uppermost dielectric layer at its upper surface. The first dielectric layer 125 may be a conformal layer, having a thickness less than half of the distance across a gap between facing sidewalls of adjacent metal lines 120. A low-k dielectric layer 130a is formed inside gaps 127 (refer to FIG. 2) between the plurality of metal wiring patterns 120 having first dielectric layer 125 thereon. Here, the first dielectric layer 125 is included in the gaps 127. Preferably, the low-k dielectric layer 130a has a lower dielectric constant than the first dielectric layer 125. In addition, a second dielectric layer 140 and an optional third dielectric layer 145 can be on the first dielectric layer 125 and the low-k dielectric layer 130a. Each of the plurality of metal wires or lines 120 may comprise a barrier layer 105 (e.g., TiN or a Ti/TiN bilayer), an aluminum (or Al—Cu alloy) layer 110 and an antireflective layer 115 (e.g., TiN or a Ti/TiN bilayer).

In a semiconductor device with such a structure as described above, the operational speed can be improved because the low-k dielectric layer 130a between adjacent metal wires 120 decreases the RC delay of the wires. Furthermore, a via-contact connecting an upper metal wiring and a lower metal wiring can be safely formed through intermetal dielectric layers 140 and 145, without necessarily coming into contact with the low-k dielectric layer 130a.

Hereinafter, an embodiment of a method for forming an intermetal dielectric layer between metal wires and/or between metal layers including a low-k dielectric material, according to the present invention, will be described with reference to FIGS. 2 to 5.

Figure 2:
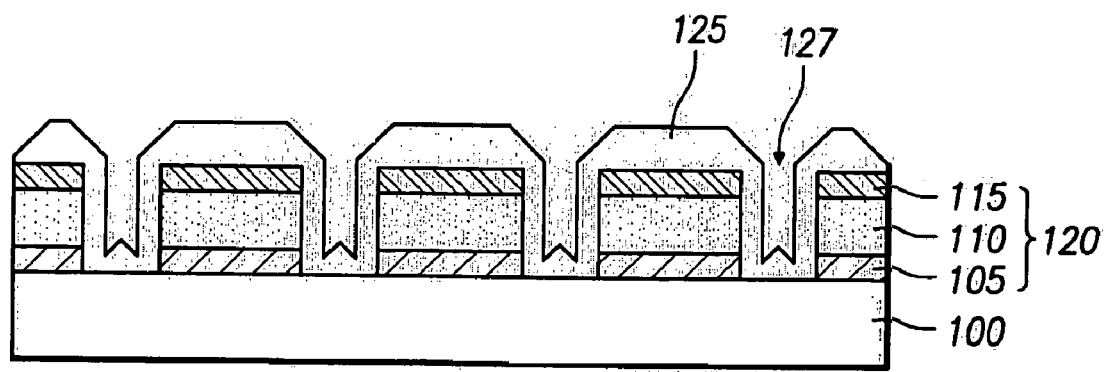
FIGS. 2 to 5 are cross-sectional views showing a method for forming an intermetal dielectric layer including a low-k dielectric material in accordance with an embodiment of the present invention.

Referring to FIG. 2, a barrier layer 105, an aluminum layer 110, and an antireflective layer 115 are formed on a substrate 100 in successive order, and are selectively etched (e.g., using photolithography and dry etching) until a portion of the substrate 100 is exposed. As a result, a metal wiring including a plurality of metal wiring patterns 120 (e.g., a metallization layer including a plurality of metal lines 120) may be formed.

Subsequently, a first dielectric layer 125 is formed on the exposed portion of the substrate 100 and the plurality of metal wiring patterns 120. Here, the first dielectric layer 125 is preferably conformally deposited to cover a profile of the metal wiring patterns 120 so as to have or maintain a gap 127 between the adjacent metal wiring patterns (i.e., two metal wires that are adjacent to and that have sidewalls that face each other). In addition, the first dielectric layer 125 may comprise silicon rich oxide or undoped silicon dioxide formed by high-density plasma chemical vapor deposition (HDP-CVD).

Figure 3:
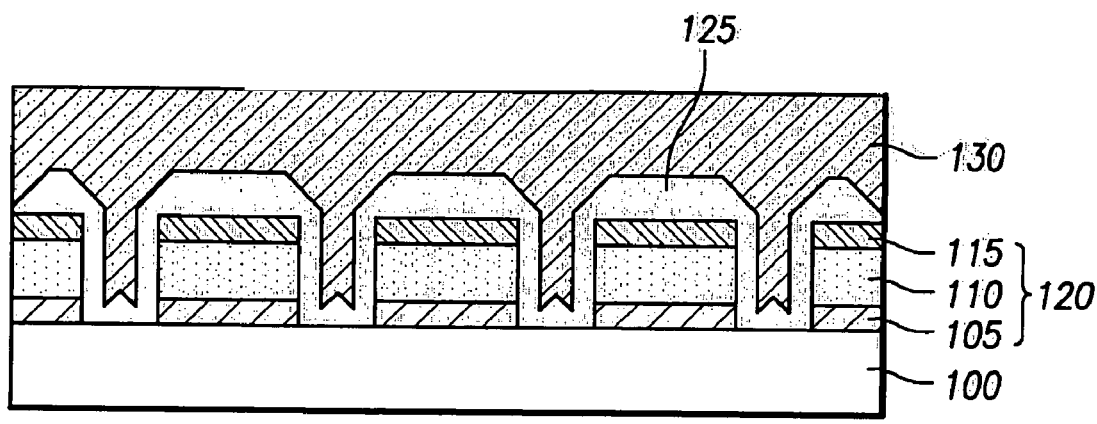

Referring to FIG. 3, a low-k dielectric material 130 is applied or deposited to sufficiently cover the first dielectric layer 125. Here, the low-k dielectric material 130 preferably comprises a SiOC-based spin-on material that can be applied to or deposited on the first dielectric layer 125 by a spin-on method (e.g., spin coating). In order to facilitate filling the gaps 127 with the low-k dielectric material in the subsequent step, it is advantageous to use a spin-on method rather than a chemical vapor deposition (CVD).

Figure 4:
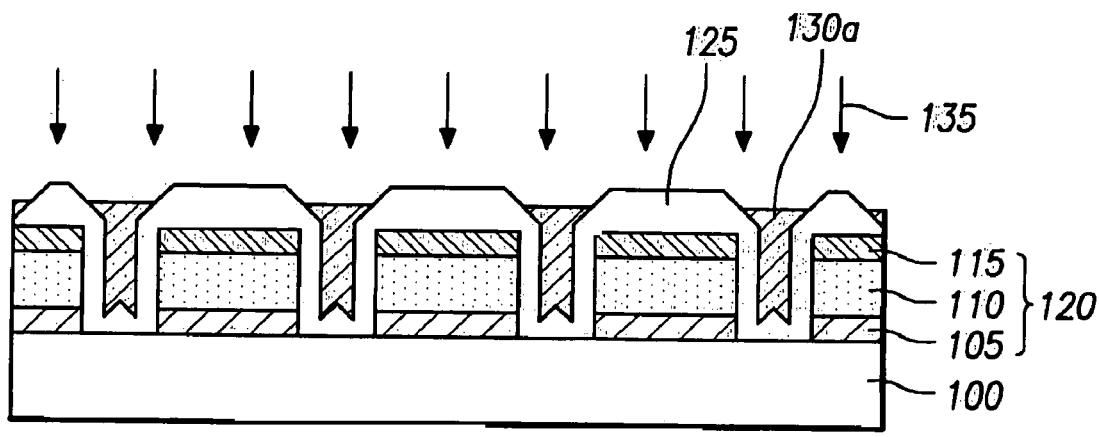

Next, the substrate 100 is rotated (e.g., at rotational speeds of from 500 to 20,000 revolutions per minute, or RPM) until the gaps 127 are sufficiently filled with the low-k dielectric material 130. Then, the low-k dielectric material 130 undergoes a heat-treatment to be densified and/or solidified. As a result, the low-k dielectric layer 130a is formed. Continuously, as shown in FIG. 4, in order to remove a portion of the low-k dielectric material (particularly that portion above the metal wires 120 in which a contact hole may be formed that exposes part of an upper surface of a particular metal wire 120), the substrate 100 undergoes dry-etching (e.g., in accordance with a conventional etchback process) using He/Ne-containing plasma 135 until the first dielectric layer 125 on the plurality of metal wiring patterns or lines is exposed.

Figure 5:
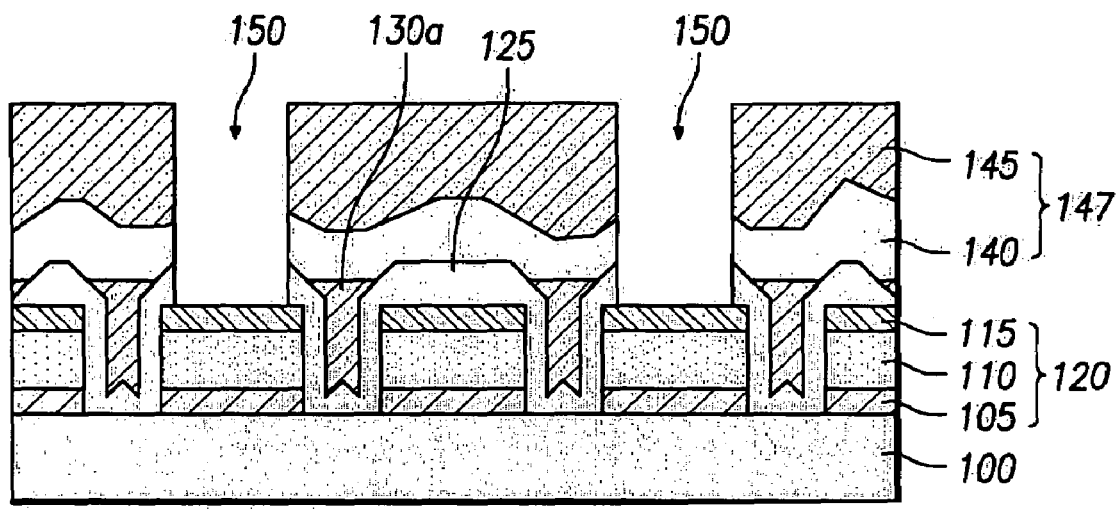

Referring to FIG. 5, an intermetal dielectric layer 147 is formed on the exposed first dielectric layer 125 and the low-k dielectric layer 130a. Here, the intermetal dielectric layer 147 may comprise a second dielectric layer 140 and a third dielectric layer 145. The second dielectric layer 140 preferably comprises a silicon rich oxide or an undoped silicon dioxide, and the third dielectric layer 145 preferably comprises a tetraethyl orthosilicate-based oxide. Especially, the second dielectric layer 140 preferably comprises the same material as the first dielectric layer 125, thus preventing defects (e.g., corrosion of the metal wiring) possibly caused by diffusion of any ingredient or component of the low-k dielectric layer 130a.

In addition, the third dielectric layer 145 may be planarized in a successive step. The planarization process can be performed in a manner known to those skilled in the art, such as an etch-back process, a chemical and mechanical polishing process, and the like.

Meanwhile, the metal wiring layer including the metal wiring patterns 120 is electrically connected to an upper metal wiring (not shown) by via-contacts. Process for forming the via-contacts includes a step of etching the intermetal dielectric layers 125, 140, and 145, thus forming via-holes 150. Here, as shown in FIG. 5, because the low-k dielectric layer 130a is not placed in a region for the via-holes to be formed, the via-holes can be safely formed.

In addition, because the low-k dielectric layer 130a is placed inside the gaps between the adjacent metal wiring patterns, a parasitic capacitance between metal wiring patterns can be decreased or vanished. As a result, the operational speed of the device can be improved.

Moreover, because intermetal dielectric layers 125 and 140 encompass or surround the low-k dielectric layer 130a, the diffusion of any ingredients or components of the low-k dielectric layer into the metal wiring can be prevented.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for forming an intermetal dielectric layer between metal wirings, comprising the steps of:
    (a) forming a metal layer on a semiconductor substrate;
    (b) forming a plurality of metal wiring patterns by etching the metal layer selectively;
    (c) forming a first dielectric layer on the substrate and the plurality of metal wiring patterns;
    (d) forming a SiOC layer on portions of the first dielectric layer above the metal wiring patterns and in a gap between sidewalls of adjacent metal wiring patterns using a spin-on method and removing a portion of the SiOC layer by dry etching until the first dielectric layer on the plurality of metal wiring patterns is exposed, the SiOC layer having a lower dielectric constant than the first dielectric layer; and
    (e) forming a second dielectric layer on the SiOC layer and the exposed first dielectric layer.

2. The method of claim 1, wherein the first dielectric layer covers a profile of the plurality of metal wiring patterns, and produces a gap encompassed by the first dielectric layer between adjacent metal wiring patterns.

3. The method of claim 1, wherein the second dielectric layer comprises substantially a same material as the first dielectric layer.

4. The method of claim 1, wherein the method further includes the step of forming a third planarized dielectric layer after step (e).

5. The method of claim 1, wherein the intermetal dielectric layer comprises the first and second dielectric layers and the SiOC layer.

6. The method of claim 1, further comprising etching the first dielectric layer and the intermetal dielectric layer to form via holes exposing a portion of an upper surface of the metal wiring patterns.

7. The method of claim 2, wherein step (d) comprises the steps of: (d1) depositing the SiOC material on the first dielectric layer; (d2) filling the gap with the SiOC material by rotating the substrate; and (d3) solidifying and/or densifying the SiOC material by heat-treatment, thereby forming the SiOC layer between adjacent metal wiring patterns.

8. The method of claim 5, further comprising forming a third dielectric layer on the second dielectric layer, and planarizing the third dielectric layer.

9. A method for forming an intermetal dielectric layer, comprising the steps of:
   (a) forming a metal layer comprising a plurality of metal wires or lines;
   (b) conformally depositing a first dielectric layer on the plurality of metal wires or lines;
   (c) forming a SiOC layer on portions of the first dielectric layer above the metal wiring patterns and in a gap between sidewalls of adjacent metal wiring patterns using a spin-on method and removing a portion of the SiOC layer by dry etching until the first dielectric layer on the plurality of metal wiring patterns is exposed, the SiOC layer having a lower dielectric constant than the first dielectric layer; and
   (d) forming a second dielectric layer on the SiOC layer and the exposed first dielectric layer.

10. The method of claim 9, wherein adjacent metal wires or lines have a gap therebetween, and the first dielectric layer has a thickness of less than half of a width of the gap.

11. The method of claim 9, wherein step (c) comprises depositing the SiOC material on the first dielectric layer while rotating the substrate.

12. The method of claim 9, wherein the second dielectric layer comprises substantially a same material as the first dielectric layer.

13. The method of claim 9, wherein the method further includes, after step (d), the step of forming a third dielectric layer on the second dielectric layer, and planarizing the third dielectric layer.

14. The method of claim 9, wherein the method further includes forming via holes over the plurality of metal wiring patterns, exposing a portion of an upper surface of the metal wiring patterns.

15. The method of claim 11, further comprising heating the SiOC material to solidify or densify it, thereby forming the SiOC layer between adjacent metal wires or lines.

16. The method of claim 13, further comprising etching the first, second, and third dielectric layers to form via holes exposing a portion of an upper surface of the metal wiring patterns.

* * * * *